United States Patent [19]
Zimmermann et al.

[11] Patent Number: 5,068,862
[45] Date of Patent: Nov. 26, 1991

[54] PULSED LASER

[75] Inventors: Clifton Zimmermann, Karlsruhe, Fed. Rep. of Germany; Glen Mumford, Milford, Del.

[73] Assignee: BASF Aktiengesellschaft, Ludwigshafen, Fed. Rep. of Germany

[21] Appl. No.: 520,812

[22] Filed: May 9, 1990

[30] Foreign Application Priority Data

May 17, 1989 [DE] Fed. Rep. of Germany ....... 3915982

[51] Int. Cl.$^5$ ................................................ H01S 3/03
[52] U.S. Cl. ........................................ 372/25; 372/38; 250/205
[58] Field of Search ..................... 372/25, 38; 250/205; 307/106, 108

[56] References Cited

U.S. PATENT DOCUMENTS 4,827,116  5/1989  Takagi et al. .......................... 372/38
4,888,777 12/1989  Takeyama ............................. 372/38

Primary Examiner—William L. Sikes
Assistant Examiner—Susan S. Morse
Attorney, Agent, or Firm—Keil & Weinkauf

[57] ABSTRACT

In order to generate precisely square-wave laser light pulses, a laser diode is fed by a current pulse generator which comprises a timing pulse generator and a power stage, which is driven by the latter and which is followed by a single-pole driver stage of high current having a rise time of a few nanoseconds for the laser diode which is connected in the circuit of a battery of capacitors.

3 Claims, 1 Drawing Sheet

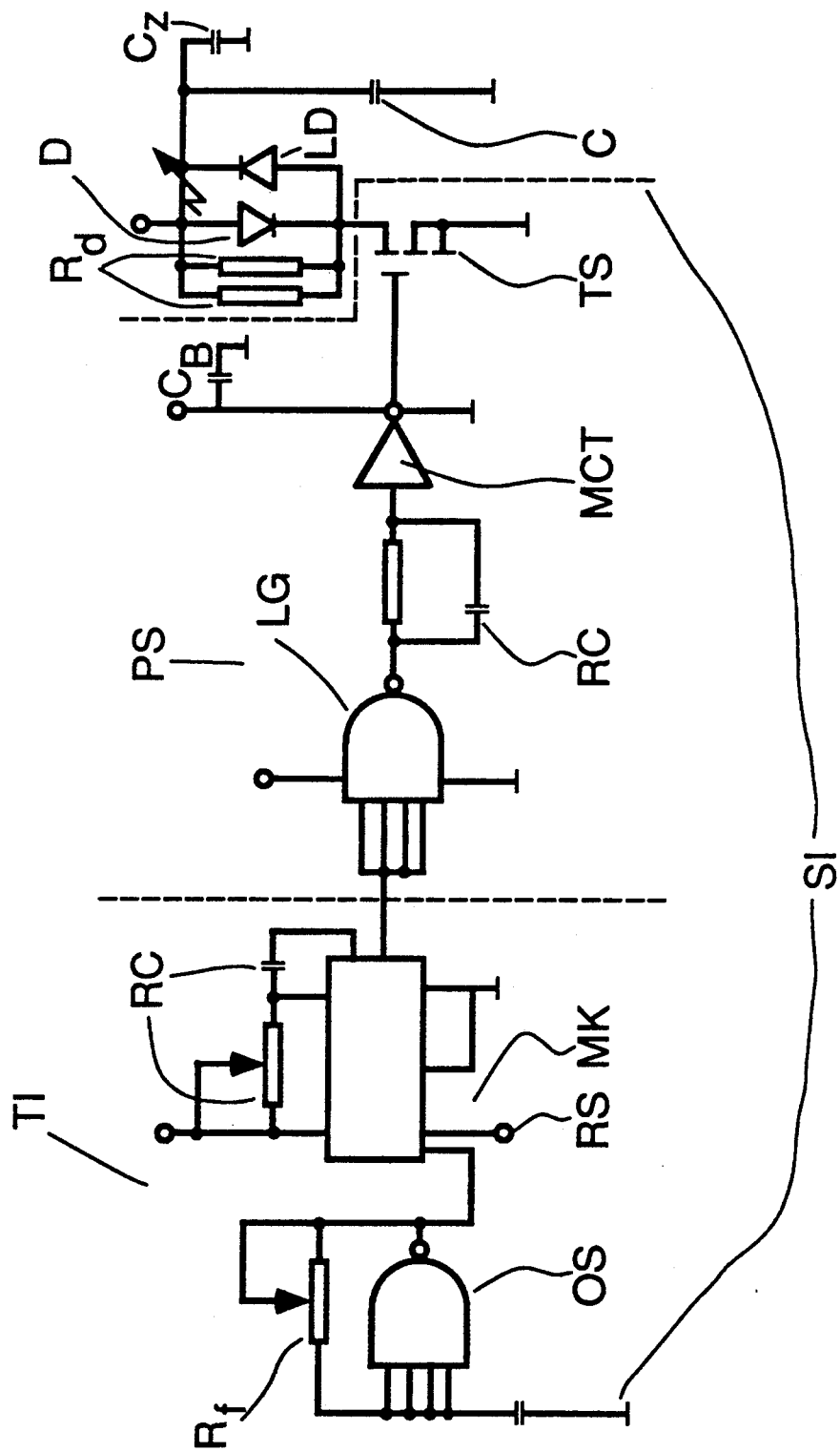

PULSED LASER

BACKGROUND OF THE INVENTION

1. Field of the Invention

The present invention relates to a pulsed laser comprising a laser diode and a current pulse generator feeding the laser diode.

2. Description of the Related Art

In order to generate laser light pulses of high power, laser diodes require high currents, which demanded hitherto costly control circuits for very narrow pulses in the nanosecond range. In this case, a fast power switch connects the laser diode to a battery of capacitors. This battery is recharged by a power supply unit in the intervals between pulses. The switches employed are bipolar transistors or thyristors which must pass into the conductive state within a few nanoseconds as determined by the steep pulse flanks. The control currents necessary for this purpose have hitherto been achieved only with the aid of complex control units.

SUMMARY OF THE INVENTION

It is an object of the present invention to develop a high-power pulsed laser which is distinguished from the known systems by substantially lower expenditure on circuitry and smaller overall dimensions, the intention being to obtain square-wave pulses which are as perfect as possible.

We have found that this object is achieved in that the current pulse generator feeding the laser diode comprises a timing pulse generator and a power stage which is driven by the latter and which is followed by a single-pole driver stage of high current having a rise time of a few nanoseconds for the laser diode which is connected in the circuit of a battery of capacitors.

BRIEF DESCRIPTION OF THE DRAWING

Further details and advantages of the pulsed laser according to the invention are described hereinbelow with reference to an illustrative embodiment shown in the drawing.

The drawing is a diagramatic representation of a pulsed laser comprising a laser diode and a current pulse generator.

DESCRIPTION OF THE PREFERRED EMBODIMENTS

The pulsed laser essentially comprises a laser diode LD and a current pulse generator SI feeding the latter. The pulse generator comprises a timing pulse generator TI, a power stage PS driven by the latter and a downstream single-pole driver stage TS for the laser diode. The timing pulse generator is constructed from an oscillator OS, for example a Schmitt trigger, and a monostable flip-flop MK driven by the latter. The frequency of the oscillator can be adjusted by means of a resistor $R_f$. The flip-flop delivers the control pulses for the laser diode LD, the pulse width of which can likewise be adjusted by an externally wired RC element. A further output of the flip-flop can be provided for a reference signal RS, for example for the synchronous operation of a laser pulse receiver. The monostable flip-flop MK is followed by the power stage PS, which comprises a power gate LG and an MOS clock driver MCT, the output current of which when using switching times in the nanosecond range is sufficiently high to switch the actual power driver TS for the laser diode LD. A blocking capacitor $C_B$ assists the fast switching-through of the MOS clock driver. The power gate and the MOS clock driver are connected via an RC coupling element.

It has proved to be advantageous to use a V-MOS field effect transistor as the power driver TS, the drain-source channel of which field effect transistor connects the laser diode to a battery of capacitors C. One battery is sufficient to supply current to the current pulse generator SI and to charge the capacitor C. When there is a positive control signal on the gate of the field effect transistor, the drain-source channel of the latter passes into the conductive state within a few nanoseconds and thus switches the laser diode LD to the battery of capacitors C, which, in order to achieve fast switching-through, is supplemented by a smaller capacitor $C_z$ connected in parallel.

In order to attenuate the overshoot of the pulse flanks, for the positive flank resistors $R_d$ and for the negative flank a diode D are connected in parallel with the laser diode.

Using the above described drive circuit, it is possible to generate precise square-wave pulses at high currents (up to 70 A). Its simple and space-saving structure permits the use of such a high-power pulsed laser in small spaces, even where a multi-channel design is employed, without connection to the mains. This means a considerable broadening of the range of possible applications of the pulsed laser.

We claim:

1. A pulsed laser comprising a laser diode fed by a current pulse generator including a power MOS field effect transistor,
    wherein said current pulse generator also includes a power stage containing a single-pole MOS clock driver driving said field effect transistor and a timing generator driving said power stage,
    said field effect transistor being of the high current type and having a rise time of a few nanoseconds and said laser diode being in the circuit of a battery of capacitors.

2. A pulsed laser as claimed in claim 1, wherein the timing pulse generator comprises an oscillator and a monostable flip-flop driven by the latter.

3. A pulsed laser as claimed in claim 1, wherein the laser diode is protected from overshooting of the pulse flanks by a passive network which is connected in parallel and which consists of a diode and resistors.

* * * * *